March 9, 1965

R. B. FERTIG 3,173,097

DIRECT CURRENT AMPLIFIER

Filed Dec. 6, 1960

INVENTOR.
RAYMOND B. FERTIG

BY

[signature]

ATTORNEY 3,173,097

DIRECT CURRENT AMPLIFIER

Raymond B. Fertig, St. Albans, W. Va., assignor to Union Carbide Corporation, a corporation of New York Filed Dec. 6, 1960, Ser. No. 74,017

4 Claims. (Cl. 330—10)

The present invention relates to an improved direct current amplifier and more particularly to such an amplifier adapted to be used as a preamplifier in conjunction with very sensitive instruments.

Very often in the laboratory there arises a need for a preamplifier either for recorders or oscillographs. Such preamplifiers enable one to extend their sensitivities down to the microvolt region and to make measurements previously impossible with these instruments. There are many D.C. amplifiers available for recorders. However, for a general purpose laboratory instrument and for inclusion in a plant instrument as a preamplifier for a recorder they have many undesirable features including complexity, excessive heat generation, too wide a frequency response, gain not continuously variable, output at too high or low a level, etc.

A number of direct current amplifiers are well known in the art. These include magnetic amplifiers, direct coupled tube type amplifiers, and the conversion type of D.C. amplifier wherein the D.C. signal is converted to A.C., amplified in an A.C. amplifier and subsequently rectified. The improved amplifier of the present invention is of this latter type.

Previous conversion type D.C. amplifiers, however, have been limited in their flexibility insofar as the type of output available, the amount of gain control possible, and degree of zero control is concerned.

It is accordingly the primary object of the present invention to provide an accurate yet flexible conversion type of D.C. amplifier.

It is a further object to provide such an amplifier having both high and low level outputs available.

It is a still further object to provide such an amplifier having a novel gain control and zero control circuitry.

Other objects and advantages will be apparent from the accompanying description and drawings in which.

The objects of the present invention are accomplished in general by a direct current amplifier which comprises alternating current amplifying means having an input circuit and an output circuit, a converter for impressing on the input circuit of the amplifier an alternating current signal derived from the direct current signal, a synchronous rectifier connected to the output circuit of the amplifier for rectifying the amplified alternating current signal, and a connection between the output circuit of the amplifier and its input for feeding back a portion of the rectified D.C. output to the input. The amplifier also has two feedback pairs prior to rectification and a gain control. A novel zero control is obtained by feeding an A.C. signal of the same frequency and in selected phase relationship with the converted D.C. signal into the amplifier to cancel out any A.C. fluctuations at the output when no D.C. signal is impressed on the input.

In the preferred form of the invention, the synchronous rectifier comprises means for effectively short-circuiting at least a portion of the output circuit of the amplifier in synchronism with the frequency of the alternating current signal and hence in synchronism with the operation of the converter. By achieving synchronized rectification in this manner, it is possible to employ therefor a switching rechanism which can be actuated by the converter. Such a switching mechanism will be described in greater detail subsequently.

In the preferred form of the invention the A.C. amplifier comprises four stages of resistance-capacitance (R.C.) coupled amplification wherein the two stages of A.C. feedback occur between the first and second and third and fourth stages respectively. The gain control is located in the grid of the third stage and permits continuous variation of the gain from zero to maximum. This is unconventional since most amplifiers using overall D.C. feedback vary the gain by varying the amount of D.C. feedback. However, varying the A.C. gain is more flexible as it permits attenuation of the output signal to zero.

Another feature of the present invention which makes it particularly suitable for a wide range of laboratory and plant uses is the provision of a high level output (gain up to 1000) for use with oscilloscopes for example and a low level output (gain up to 20) for use with recorders and the like. Use of the instant amplifier as a preamplifier for such instruments facilitates extending their range into the micro-volt region.

The invention will now be described in greater detail with reference to the accompanying drawings.

Figure 1:
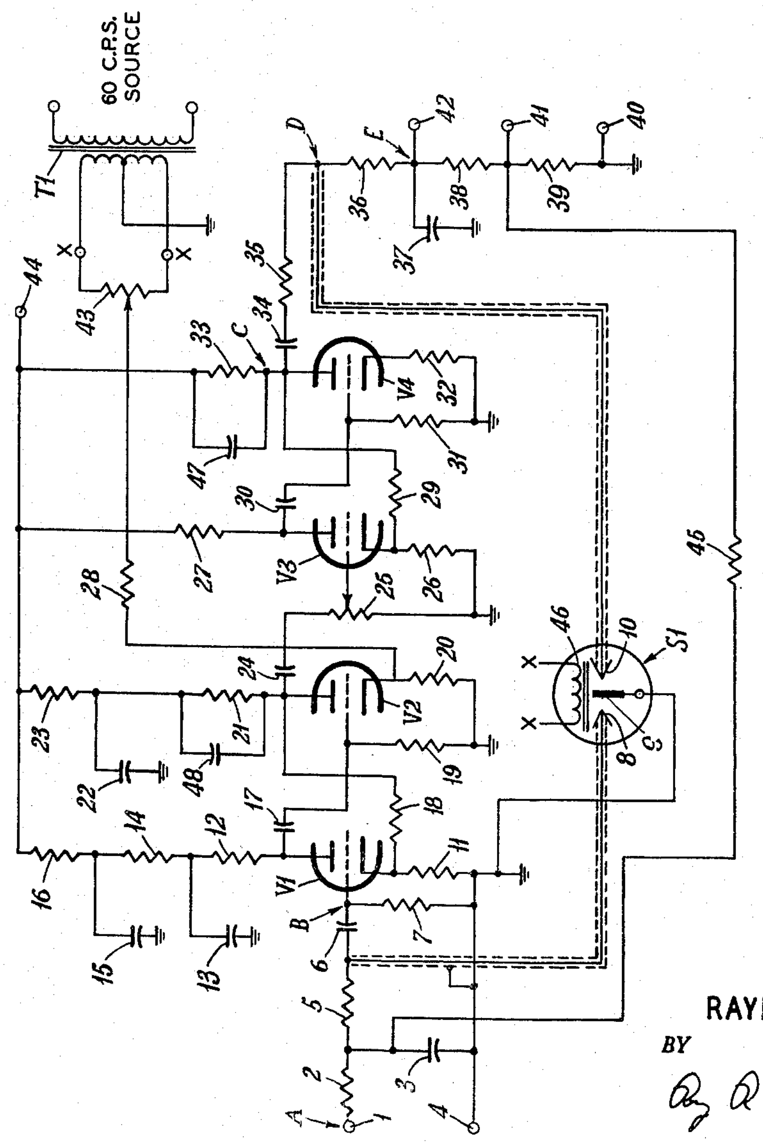
FIG. 1 is a schematic diagram of a D.C. amplifier embodying the improved circuitry of the present invention.

Referring to FIG. 1, in general the amplifier comprises D.C. signal input terminals 1 and 4 and an input filter comprising resistor 2 and condenser 3 for removing any stray A.C. variations in the input. The four triodes V1, V2, V3, and V4 provide four stages of A.C. amplification. A.C. feedback resistors 18 and 29 provide negative feedback between the plate of V2 and the cathode of V1 and the plate of V4 and the cathode of V3 respectively. As stated above the gain control potentiometer 25 is located in the grid of V3. Transformer T1 provides a 60 cycle source to the zero control potentiometer 43 and also energizes the field coil 46 of the single-pole-double-throw switch S1 through terminals X—X.

Figure 2:
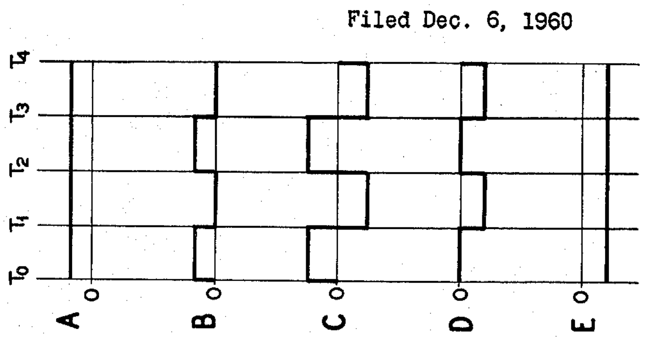
FIG. 2 is a set of waveforms illustrative of the operation of the device shown in FIG. 1.

This switch is commonly known as a contact modulator and performs both the functions of converting the D.C. input signal to an A.C. signal which can be readily amplified and synchronously rectifying the amplified A.C. output signal from the amplifier. The modulator comprises a vibrating armature 9 having a contact thereon connected to ground. The armature is polarized and is driven back and forth between contacts 8 and 10 by coil 46. As stated previously the coil 46 is connected to transformer T1 and is accordingly energized at a 60 c.p.s. rate which in turn drives the armature 9 at a 60 c.p.s. rate alternately grounding the D.C. input signal and the A.C. output signal. The operation of this unit is readily apparent from FIG. 2 wherein curve A represents the small D.C. input signal. Curve B represents the converted signal appearing at point B in FIG. 1. Curve C represents the amplified A.C. signal appearing across the plate load resistor 33 at point C in FIG. 1. Curve D represents the voltage at point D in FIG. 1 after rectification by contact 10 and armature 9 of S1. Curve E represents the filtered D.C. output available at the output terminals 40, 41, and 42 due to the filtering action of condenser 37.

In a typical operating sequence the D.C. input voltage is applied to terminals 1 and 4 and causes current to flow through resistor 2 to capacitor 3. Any stray A.C. voltages are attenuated by the filtering action of resistor 2 and capacitor 3. The D.C. voltage across capacitor 3 also appears at the junction of isolating resistor 5 and coupling capacitor 6 where it is chopped at a 60 c.p.s. rate by contact 8 and armature 9 of switch S1. The chopped 60 c.p.s. voltage is applied to the grid of vacuum tube V1 through coupling capacitor 6. Resistor 7 is the grid resistor and resistor 11 is the cathode bias resistor for vacuum tube V1. The A.C. signal on the grid of vacuum tube V1 is amplified by this tube and appears across plate load resistor 12 where it passes through coupling capacitor 17 to the grid of vacuum tube V2. Resistor 16, capacitor 15, resistor 14 and capacitor 13 make up a two section R-C filter for the purpose of removing noise from the B+ supply connected to terminal 44. Resistor 19 is the grid resistor and resistor 20 is the cathode bias resistor for vacuum tube V2. The A.C. signal appearing at the grid of vacuum tube V2 is amplified by this tube and appears across plate load resistor 21 where it passes through coupling capacitor 24 to gain control 25. Capacitors 48 and 47 prevent the amplifier from oscillating by attenuating the gain of the amplifier at high frequencies. Resistor 18 is a feedback resistor which applies a portion of the signal appearing at the plate of vacuum tube V2 to the cathode of vacuum tube V1. This feedback network is used to help stabilize the gain of vacuum tubes V1 and V2. All or a part of the signal appearing across the gain control 25 (depending on the setting of this potentiometer) is applied to the grid of vacuum tube V3. Gain control 25 serves as the grid resistor and resistor 26 is the cathode bias resistor for vacuum tube V3. The A.C. signal appearing at the grid of vacuum tube V3 is amplified by this tube and appears across plate load resistor 27 where it passes through coupling capacitor 30 to the grid of vacuum tube V4. Resistor 31 is the grid resistor and resistor 32 is the cathode bias resistor for vacuum tube V4. The A.C. signal on the grid of vacuum tube V4 is amplified by this tube and appears across plate load resistor 33 where it passes through coupling capacitor 34 and resistor 35 to contact 10 and armature 9 of switch S1. Resistor 29 is a feedback resistor which applies a portion of the signal appearing at the plate of vacuum tube V4 to the cathode of vacuum tube V3. The purpose of this feedback network is to help stabilize the gain of vacuum tubes V3 and V4. After rectification by switch S1, the pulsating D.C. signal is filtered by resistor 36 and capacitor 37 and flows through resistors 38 and 39 to ground. The output signal is taken from between terminal 42 and ground terminal 40 if a high level, high impedance signal is desired or from between terminals 41 and 40 if a low level, low impedance signal is desired. Feedback resistor 45 is connected between terminal 41 and the junction of resistors 2 and 5 and capacitor 3. The purpose of this feedback network is to compensate for minor variations in the chopper and the A.C. amplifier gain in a manner well understood in the art. Potentiometer 43 is connected across a winding of power transformer T1 and provides a source of 60 c.p.s. voltage which is attenuated by resistor 28 and applied to the cathode of vacuum tube V2. This network provides a small A.C. voltage which is used to buck out any stray A.C. voltages which may be picked up by the grid of vacuum tube V1 and thus serves as a zero control.

The zero control is unique in that it injects a small 60 c.p.s. signal from a potentiometer across the filament winding through a ten megohm resistor to the cathode of the second stage. This control can also be used for a limited amount of zero suppression. Tests have shown that the overnight stability is better than ±5 microvolts with reference to the input. It further provides a very simple means of obtaining a zero control and a limited amount of zero suppression without the use of separate power supplies, complicated circuitry or batteries.

The gain control circuit in conjunction with a limited amount of over-all D.C. feedback gives the flexibility of a continuous type gain control with some of the advantages of over-all D.C. feedback. Prior art amplifiers either vary the gain by changing the amount of D.C. feedback employed, usually by a step type attenuator which does not permit a continuous variation of the gain from zero to maximum or, if the feedback network is omitted, a continuous type of gain control is usually employed. However, the instant combination of a continuous type gain control plus a moderate amount of over-all D.C. feedback, results in a very flexible amplifier with gain stability and linearity found only in amplifiers utilizing far more complicated circuitry and methods.

Suitable sizes of the resistors 36, 38 and 39 in the output network have been found to be 47KΩ, 47KΩ and 1KΩ respectively. Taking the output across terminals 40 and 41 provides a low level output while taking the output across terminals 40 and 42 provides a high level output.

The combination of over-all negative D.C. feedback, two stages of negative A.C. feedback, the use of a gain control in the A.C. amplifier, and the unique zero control circuit provides an extremely sensitive and stable D.C. amplifier which has proved very satisfactory for both laboratory and plant applications. The two output levels give greater flexibility whereby the amplifier is readily adaptable to either oscillographs or recorders thus greatly extending its range of usefulness.

While a preferred embodiment of the invention has been disclosed and described, it is to be understood that certain modifications and substitutions could be made by a person skilled in the art without departing from the spirit and scope of the invention.

What is claimed is:

1. A direct current amplifier comprising, in combination, a D.C. input section; a D.C. output section; an alternating current amplifier having at least one stage with an A.C. input section and an A.C. output section; a converter connected from said D.C. input section to a ground to convert a D.C input signal at said D.C. input section to an A.C. signal; a synchronous rectifier connected from a final A.C. output section to said ground to rectify an A.C. signal at said final A.C. output section to a D.C. output signal; a D.C. feedback impedance path connected from said D.C. output section to said D.C. input section; local A.C. feedback means and an A.C. gain control for said alternating current amplifier; and a variable zero control circuit connected from a separate A.C. source having a frequency equal to that of said first recited A.C. signal to said A.C. output section of said one stage of said alternating current amplifier which A.C. output section of said one stage is at a potential opposite in phase to the phase of said separate A.C. source.

2. An amplifier as set forth in claim 1 wherein the converter connected from said D.C. input section to a ground consists of one half of a single pole double throw contact modulator and the synchronous rectifier connected from said final A.C. output section to said ground consists of the other half of said single pole double throw contact modulator, said contact modulator having a single pole moving contactor connected to said ground and having an operating coil energized from the same separate A.C. source as the zero control circuit.

3. A direct current amplifier comprising, in combination, a direct current signal input section; a converter connected from said direct current signal input section to a ground to convert a direct current input signal at said input section to an alternating current signal; a four stage R-C coupled alternating current amplifier connected to said converter and having negative feedback circuits connected respectively from second and fourth plate circuits to first and third cathode circuits of said amplifier; a synchronous rectifier connected from an output of the fourth stage of said alternating current amplifier to said ground to rectify an alternating current signal at said output to a direct current output signal; a direct current signal output section connected to said synchronous rectifier; filter means in said direct current signal output section; a direct current degenerative feedback impedance path connected from said direct current signal output section to said direct current signal input section; and a variable zero control circuit connected from a separate alternating current source having a frequency equal to that of said first recited alternating current signal to an A.C. output of a stage in said alternating current amplifier which A.C. output is at a potential opposite in phase to the phase of said separate alternating current source.

4. An amplifier as set forth in claim 3 wherein the converter connected from said direct current signal input section to a ground consists of one half of a single pole double throw contact modulator and the synchronous rectifier connected from the output of said fourth stage to said ground consists of the other half of said single pole double throw contact modulator, said contact modulator having a single pole moving contactor connected to said ground and having an operating coil energized from the same separate alternating current source as the zero control circuit.

References Cited in the file of this patent

UNITED STATES PATENTS

| | | |
|---|---|---|
| 1,854,854 | Miessner | Apr. 19, 1932 |
| 2,694,142 | Laidig | Nov. 9, 1954 |
| 2,888,523 | Ross | May 26, 1959 |
| 2,896,027 | Smith | July 21, 1959 |
| 3,042,877 | Barnes | July 3, 1962 |

FOREIGN PATENTS

| | | |
|---|---|---|
| 102,339 | Austria | Nov. 4, 1937 |